United States Patent
Adams

(10) Patent No.: US 11,321,047 B2
(45) Date of Patent: May 3, 2022

(54) VOLUME ADJUSTMENTS

(71) Applicant: Sorenson IP Holdings, LLC, Salt Lake City, UT (US)

(72) Inventor: Mark Adams, Lehi, UT (US)

(73) Assignee: Sorenson IP Holdings, LLC, Salt Lake City, UT (US)

( * ) Notice: Subject to any disclaimer, the term of this patent is extended or adjusted under 35 U.S.C. 154(b) by 0 days.

(21) Appl. No.: 16/899,306

(22) Filed: Jun. 11, 2020

(65) Prior Publication Data
US 2021/0389925 A1 Dec. 16, 2021

(51) Int. Cl.
*G06F 3/16* (2006.01)
*G10L 25/51* (2013.01)
*G10L 21/0208* (2013.01)
*G10L 25/84* (2013.01)

(52) U.S. Cl.
CPC .......... *G06F 3/165* (2013.01); *G10L 21/0208* (2013.01); *G10L 25/51* (2013.01); *G10L 25/84* (2013.01); *G10L 2021/02082* (2013.01)

(58) Field of Classification Search
CPC combination set(s) only.
See application file for complete search history.

(56) References Cited

U.S. PATENT DOCUMENTS

| | | |
|---|---|---|
| 4,777,469 A | 10/1988 | Engelke et al. |
| 4,959,847 A | 9/1990 | Engelke et al. |
| 5,081,673 A | 6/1992 | Engelke et al. |
| 5,315,585 A | 5/1994 | Izuka et al. |
| 5,325,417 A | 6/1994 | Engelke et al. |
| 5,327,479 A | 7/1994 | Engelke et al. |
| 5,351,288 A | 9/1994 | Engelke et al. |
| 5,432,837 A | 7/1995 | Engelke et al. |
| D364,865 S | 12/1995 | Engelke et al. |
| 5,581,593 A | 12/1996 | Engelke et al. |
| 5,604,786 A | 2/1997 | Engelke et al. |
| 5,687,222 A | 11/1997 | McLaughlin et al. |
| 5,724,405 A | 3/1998 | Engelke et al. |
| 5,809,425 A | 9/1998 | Colwell et al. |
| 5,815,496 A | 9/1998 | Flanagan et al. |
| 5,909,482 A | 6/1999 | Engelke |
| 5,974,116 A | 10/1999 | Engelke et al. |
| 5,978,654 A | 11/1999 | Colwell et al. |
| 6,075,841 A | 6/2000 | Engelke et al. |
| 6,075,842 A | 6/2000 | Engelke et al. |
| 6,233,314 B1 | 5/2001 | Engelke |
| 6,307,921 B1 | 10/2001 | Engelke et al. |
| 6,493,426 B2 | 12/2002 | Engelke et al. |
| 6,496,798 B1 | 12/2002 | Huang et al. |
| 6,504,910 B1 | 1/2003 | Engelke et al. |
| 6,510,206 B2 | 1/2003 | Engelke et al. |
| 6,516,050 B1 | 2/2003 | Tasaki et al. |
| 6,549,611 B2 | 4/2003 | Engelke et al. |
| 6,567,503 B2 | 5/2003 | Engelke et al. |
| 6,594,346 B2 | 7/2003 | Engelke |

(Continued)

*Primary Examiner* — Akelaw Teshale
(74) *Attorney, Agent, or Firm* — Maschoff Brennan

(57) ABSTRACT

A method to adjust volume may include obtaining an audio signal during a communication session between a first device and a second device. The method may also include adjusting a volume level of the audio signal so that the volume level is a particular volume level above a noise floor of the audio signal and directing the adjusted audio signal to a remote transcription system.

19 Claims, 7 Drawing Sheets

(56) References Cited

U.S. PATENT DOCUMENTS

| | | |
|---|---|---|
| 6,603,835 B2 | 8/2003 | Engelke et al. |
| 6,748,053 B2 | 6/2004 | Engelke et al. |
| 6,882,707 B2 | 4/2005 | Engelke et al. |
| 6,885,731 B2 | 4/2005 | Engelke et al. |
| 6,934,366 B2 | 8/2005 | Engelke et al. |
| 7,003,082 B2 | 2/2006 | Engelke et al. |
| 7,006,604 B2 | 2/2006 | Engelke |
| 7,164,753 B2 | 1/2007 | Engelke et al. |
| 7,319,740 B2 | 1/2008 | Engelke et al. |
| 7,555,104 B2 | 6/2009 | Engelke |
| 7,660,398 B2 | 2/2010 | Engelke et al. |
| 7,881,441 B2 | 2/2011 | Engelke et al. |
| 8,213,578 B2 | 7/2012 | Engleke et al. |
| 8,379,801 B2 | 2/2013 | Romriell et al. |
| 8,416,925 B2 | 4/2013 | Engelke et al. |
| 8,908,838 B2 | 12/2014 | Engelke et al. |
| 8,917,821 B2 | 12/2014 | Engelke et al. |
| 8,917,822 B2 | 12/2014 | Engelke et al. |
| 9,350,857 B1 | 5/2016 | Engelke et al. |
| 9,380,150 B1* | 6/2016 | Bullough ............... H04M 3/002 |
| 9,755,605 B1* | 9/2017 | Li ............................ H03G 3/02 |
| 10,057,532 B2* | 8/2018 | Stroffolino ............... H04N 5/60 |
| 10,388,272 B1* | 8/2019 | Thomson ................ G06F 40/44 |
| 10,573,312 B1* | 2/2020 | Thomson ................ G10L 15/22 |
| 10,574,804 B2 | 2/2020 | Leimer |
| 2003/0007633 A1 | 1/2003 | Tucker et al. |
| 2004/0101145 A1* | 5/2004 | Falcon ...................... H04S 7/00 381/64 |
| 2004/0193422 A1 | 9/2004 | Fado ..................... G10L 13/033 704/260 |
| 2006/0126866 A1* | 6/2006 | Falcon ...................... H04S 7/00 381/104 |
| 2007/0007331 A1* | 1/2007 | Jasper ...................... G07G 1/14 235/379 |
| 2008/0043996 A1* | 2/2008 | Dolph ................ H04N 21/4334 379/388.07 |
| 2008/0187108 A1 | 8/2008 | Engelke et al. |
| 2009/0089042 A1 | 4/2009 | Wald et al. |
| 2011/0081026 A1* | 4/2011 | Ramakrishnan .... G10L 21/0208 381/94.3 |
| 2011/0170672 A1 | 7/2011 | Engelke et al. |
| 2011/0305346 A1* | 12/2011 | Daubigny ................ H03G 3/32 381/28 |
| 2012/0250837 A1 | 10/2012 | Engleke et al. |
| 2013/0006404 A1* | 1/2013 | Pitkanen ................. G06F 3/167 700/94 |
| 2013/0201272 A1 | 8/2013 | Enbom |
| 2013/0317818 A1 | 11/2013 | Bigham et al. |
| 2014/0140537 A1* | 5/2014 | Soulodre ................ H03G 9/005 381/104 |
| 2014/0229171 A1 | 8/2014 | Atti et al. |
| 2015/0016633 A1* | 1/2015 | Gao ........................ H03G 3/32 381/107 |
| 2015/0230033 A1* | 8/2015 | Sprague ................ H04R 25/48 381/313 |
| 2015/0319546 A1* | 11/2015 | Sprague ............... H04R 1/1066 381/312 |
| 2015/0326965 A1* | 11/2015 | Sprague ............... H04R 25/405 381/317 |
| 2016/0330396 A1* | 11/2016 | Garcia Navarro ......................... H04N 21/42204 |
| 2016/0336023 A1* | 11/2016 | Guyott ..................... H03G 3/02 |
| 2016/0373872 A1* | 12/2016 | Chen ..................... H04M 1/605 |
| 2017/0330561 A1* | 11/2017 | Nakatsu ................. G06F 3/165 |
| 2018/0067641 A1* | 3/2018 | Lerner ..................... G10L 21/02 |
| 2020/0320975 A1* | 10/2020 | Spata ..................... G10L 15/22 |
| 2020/0388299 A1* | 12/2020 | Kawai ................... G10L 21/034 |
| 2021/0014613 A1* | 1/2021 | Carrigan ............... H04R 1/1041 |
| 2021/0084381 A1* | 3/2021 | Marten ............. H04N 21/4856 |

\* cited by examiner

VOLUME ADJUSTMENTS

FIELD

The embodiments discussed in the present disclosure are related to volume adjustments.

BACKGROUND

Transcriptions of audio communications between people may assist people that are hard-of-hearing or deaf to participate in the audio communications. To provide the transcriptions to a hard-of-hearing or deaf person, a particular device or application running on a mobile device or computer may be used to provide audio to a system to generate text transcriptions of the audio for presentation to the hard of hearing or deaf person.

The subject matter claimed herein is not limited to embodiments that solve any disadvantages or that operate only in environments such as those described above. Rather, this background is only provided to illustrate one example technology area where some embodiments described herein may be practiced.

SUMMARY

According to one or more aspects of the present disclosure, a method to adjust volume may include obtaining an audio signal during a communication session between a first device and a second device. The method may also include adjusting a volume level of the audio signal so that the volume level is a particular volume level above a noise floor of the audio signal and directing the adjusted audio signal to a remote transcription system.

BRIEF DESCRIPTION OF THE DRAWINGS

Example embodiments will be described and explained with additional specificity and detail through the use of the accompanying drawings in which.

DESCRIPTION OF EMBODIMENTS

Some embodiments in this disclosure relate to systems and methods that may be configured to adjust volume of an audio signal. For example, in some embodiments, the volume of an audio signal may be adjusted such that the volume is at a particular level above a noise floor. The volume of the audio signal may be continuously adjusted such that the volume is at the particular level above the noise floor on a continuous basis.

In some embodiments, the audio signal may be an audio signal obtained during a communication session. In some embodiments, the communication session may include a first device and a second device. During the communication session, audio signals obtained on a receive port of the first device may be provided to a remote transcription system. The remote transcription system may generate a transcript of the received audio signal and provide the transcript to the first device.

In some embodiments, the audio signals obtained at the receive port may include audio signals that originate at the second device, such as audio signals that include spoken words of a user of the second device. The audio signals obtained at the receive port may also include echoes of audio signals directed to the second device from the first device, such as line echo signals. In these and other embodiments, the volume of the audio signal that includes echoes may be adjusted such that the audio signals that include echoes may be at a consistent volume above the noise floor when received at the remote transcription system.

In some embodiments, the remote transcription system may not generate transcriptions of audio signals that include echoes. In these and other embodiments, having the audio signals that include echoes at a consistent volume may help the remote transcription system identify the audio signals as audio signals for which a transcription is not generated. Alternately or additionally, having the audio signals that include echoes at a consistent volume may allow the remote transcription system to register the audio signals that include echoes. For example, the remote transcription system may include one or more human agents that may assist in the transcription process. The audio signals that include echoes being at a consistent volume may assist the human agents to identify the audio signals as being audio signals that include echoes and may also assist the human agents to be able to hear the audio signals that include echoes. The human agents being able to hear the audio signals that include echoes may assist the human agents by providing context with respect to the audio signal originating at the second device. The context may assist the human agents in their role in the remote transcription system during the generation of the transcripts of the audio signals that originate at the second device.

Figure 1:
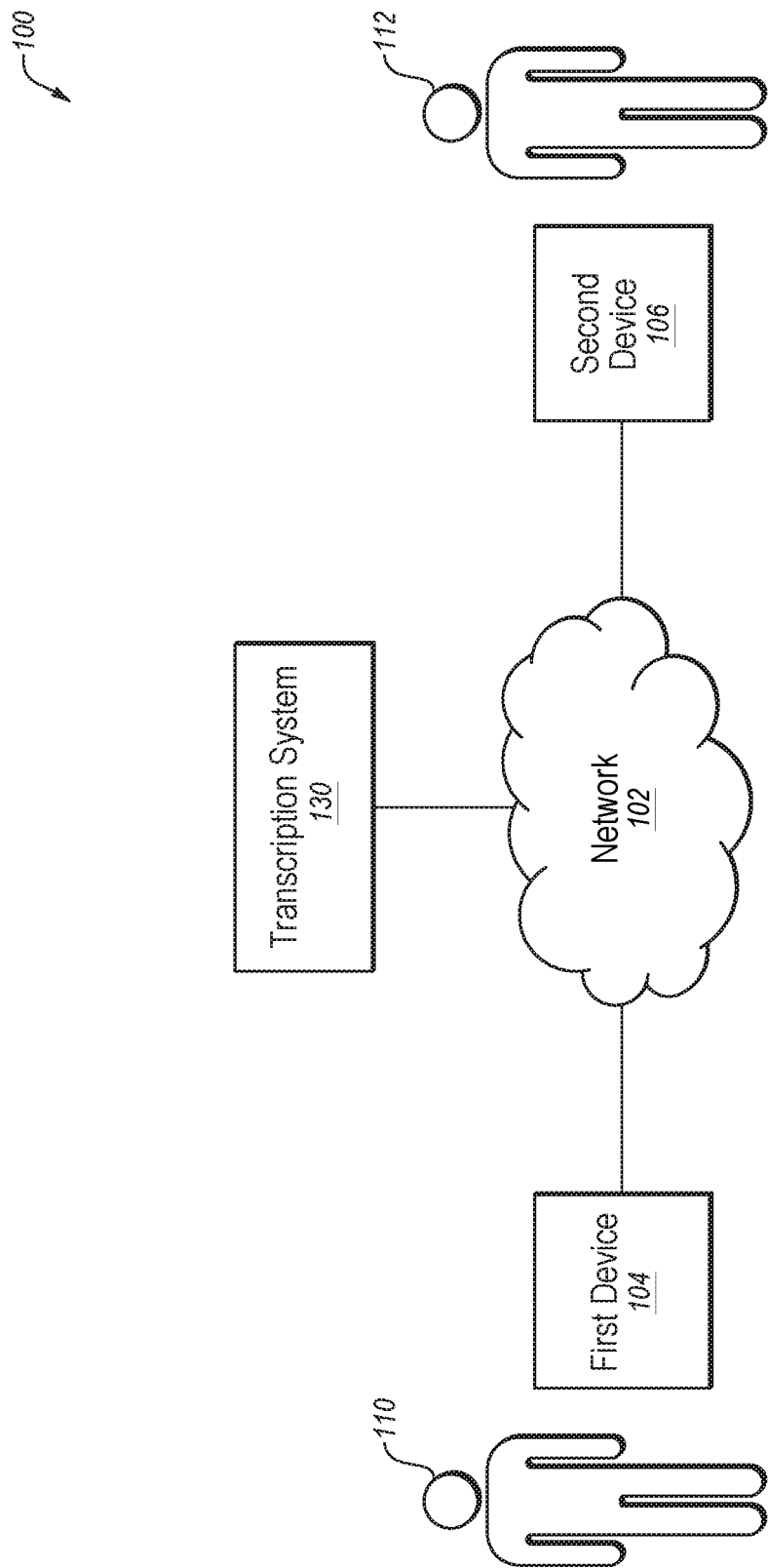
FIG. 1 illustrates an example environment for volume adjustment.

Turning to the figures, FIG. 1 illustrates an example environment 100 for volume adjustment. The environment 100 may be arranged in accordance with at least one embodiment described in the present disclosure. The environment 100 may include a network 102, a first device 104, a second device 106, and a transcription system 130.

The network 102 may be configured to communicatively couple the first device 104, the second device 106, and the transcription system 130. In some embodiments, the network 102 may be any network or configuration of networks configured to send and receive communications between systems and devices. In some embodiments, the network 102 may include a wired network, an optical network, and/or a wireless network, and may have numerous different configurations, including multiple different types of networks, network connections, and protocols to communicatively couple devices and systems in the environment 100. In some embodiments, the network 102 may also be coupled to or may include portions of a telecommunications network, including telephone lines, for sending data in a variety of different communication protocols, such as a plain old telephone system (POTS).

Each of the first and second devices 104 and 106 may include or be any electronic or digital computing device. For example, the first device 104 may include a telephone, a phone console, a caption device, a captioning telephone, or any other computing device that may be used for communication between the first user 110 of the first device 104 and the second user 112 of the second device 106. The second device 106 may include a desktop computer, a laptop computer, a smartphone, a mobile phone, a tablet computer, a telephone, a phone console, a caption device, a captioning telephone, or any other computing device that may be used for communication between the first user 110 of the first device 104 and the second user 112 of second device 106.

In some embodiments, each of the first device 104 and the second device 106 may include memory and at least one processor, which are configured to perform operations as described in this disclosure, among other operations. In some embodiments, each of the first device 104 and the second device 106 may include computer-readable instructions that are configured to be executed by each of the first device 104 and the second device 106 to perform operations described in this disclosure.

In some embodiments, each of the first and second devices 104 and 106 may be configured to establish communication sessions with other devices. For example, each of the first and second devices 104 and 106 may be configured to establish an outgoing communication session, such as a telephone call, with another device over a telephone line or network. For example, the first device 104 may be coupled with the network 102 over a POTS line.

In some embodiments, each of the first and second devices 104 and 106 may be configured to obtain audio during a communication session. The audio may be part of an audio communication, such as a telephone call. As used in this disclosure, the term audio or audio signal may be used generically to refer to sounds that may include spoken words. Furthermore, the term "audio" or "audio signal" may be used generically to include audio in any format, such as a digital format, an analog format, or a propagating wave format.

As an example of obtaining audio, the first device 104 may be configured to obtain first audio from the first user 110. For example, the first device 104 may obtain the first audio from a microphone of the first device 104 or from another device that is communicatively coupled to the first device 104.

The second device 106 may also be configured to obtain second audio from a second user 112. In some embodiments, the second device 106 may obtain the second audio from a microphone of the second device 106 or from another device communicatively coupled to the second device 106. During the communication session, the first device 104 may provide the first audio for the second device 106. Alternatively or additionally, the second device 106 may provide the second audio for the first device 104. One or both of the first device 104 and the second device 106 may be configured to provide obtained audio to the transcription system 130.

In some embodiments, the transcription system 130 may be configured to generate a transcription of the audio received from either one or both of the first device 104 and the second device 106. The transcription system 130 may also provide the generated transcription of the audio to either one or both of the first device 104 and the second device 106. Either one or both of the first device 104 and the second device 106 may be configured to present the transcription received from the transcription system 130. For example, the first device 104 may be configured to display the received transcriptions on a display that is part of the first device 104 or that is communicatively coupled to the first device 104. With respect to FIG. 1, the disclosure may discuss obtaining information and presenting transcriptions to the first device 104 and/or the first user 110 for easy in explanation. However, any description of obtaining information and presenting transcriptions may apply to both the first device 104 and the second device 106 unless otherwise specified.

The transcription system 130 may be configured to generate a transcription of audio using an automatic transcription system. Fully machine-based automatic speech recognition ASR systems may operate without human intervention. Alternately or additionally, the transcription system 130 may be configured to generate a transcription of audio using a revoicing transcription system. The revoicing transcription system may receive and broadcast audio to a human agent. The human agent may listen to the broadcast and speak the words from the broadcast. The words spoken by the human agent are captured to generate revoiced audio. The revoiced audio may be used by a speech recognition program to generate the transcription of the audio.

In some embodiments, the transcription system 130 may include any configuration of hardware, such as processors, servers, and database servers that are networked together and configured to perform a task. For example, the transcription system 130 may include one or multiple computing systems, such as multiple servers that each include memory and at least one processor.

In some embodiments, the first device 104 may be configured to adjust a volume level of audio from a communication session between the first device 104 and the second device 106 that is directed to the transcription system 130 over the network 102. In these and other embodiments, audio that is directed to the transcription system 130 may include audio that is obtained by the first device 104 during a communication session at a communication port of the first device 104 from the network 102 and may be referred to with respect to FIG. 1 as obtained audio.

In some embodiments, the first device 104 may be configured to adjust the volume of the obtained audio to a particular volume level above a noise floor of the audio. Adjusting the volume level of the obtained audio may include increasing the volume level of the audio to the particular volume level or decreasing the volume level of the audio to the particular volume level.

In some embodiments, the particular volume level may be a volume level audible by a human. For example, the particular volume level may be a volume level that corresponds to a softly spoken voice. For example, the particular volume level may be between two and fifteen decibels above the noise floor. For example, the particular volume level may be 2, 4, 6, 8, 10, 12, 14, or 15 decibels above the noise floor. In some embodiments, the particular volume level may be at a volume level that ranges between 20 and 70 dB. However, the perceived volume level of the echo audio may be at a soft level as the volume level may be based on the noise floor of the obtained audio. In these and other embodiments, the noise floor of the obtained audio may be a volume level of the sum of all the noise sources within the obtained audio besides the echo audio and the second audio from the second device 106 that corresponds to the voice of the second user 112. The noise sources may include thermal noise, incidental noise, and black body noise, among other noise sources.

In some embodiments, the first device 104 may be configured to audibly broadcast the obtained audio without adjusting the volume level of the obtained audio to the particular volume level. For example, the first device 104 may audibly broadcast the obtained audio to allow the first user 110 to hear the obtained audio without adjusting the volume level of the obtained audio to the particular volume level. The first device 104 may also be configured to adjusting the volume level of the obtained audio to the particular volume level and directed the obtained audio with the adjusted volume level to the transcription system 130.

In some embodiments, the first device 104 may be configured to adjust the volume level of obtained audio that includes an echo of the first audio directed to the second device 106. For example, when directing the first audio to the second device 106, the configuration of a portion of the network 102 and/or the first device 104 may result in a line echo that directs a portion of the first audio back to the first device 104 as an echo. Audio that includes an echo of the first audio directed to the second device 106 may be referred to in this disclosure as echo audio.

In some embodiments, the first device 104 may be configured to distinguish between echo audio and the second audio originating at the second device 106. In response to the first device 104 determining the obtained audio includes echo audio, the first device 104 may be configured to adjust the volume level of the echo audio to the particular volume level. In these and other embodiments, the first device 104 may be configured to automatically and/or continuously adjust the volume level of the echo audio to the particular volume level.

For example, during a duration that the first device 104 identifies obtained audio as echo audio during a communication session, the first device 104 may adjust the volume level of the echo audio to the particular volume level. The first device 104 may direct the echo audio with the adjusted volume level to the transcription system 130. As such, the volume level of the echo audio received by the transcription system 130 may be substantially consistent during a communication session regardless of differences in volume level of the echo or the first signal that results in the echo. In some embodiments, the transcription system 130 may be configured to not generate a transcription of the echo audio. Thus, no transcription of the echo audio may be provided by the transcription system 130 to the first device 104. Alternately or additionally, the transcription system 130 may be configured to generate a transcription but not provide the transcription to the first device 104 and/or the second device 106.

In some embodiments, in response to the first device 104 determining that obtained audio is second audio, the first device 104 may not adjust the volume level of the second audio to the particular level above the noise floor. In these and other embodiments, the first device 104 may direct the second audio to the transcription system 130. The transcription system 130 may be configured to generate a transcription of the second audio of the transcription system 130.

In some embodiments, the first device 104 may be configured to distinguish between the second audio and the echo audio based on correlating the obtained audio with the first audio transmitted to the second device 106. For example, during the communication between the first device 104 and the second device 106, a microphone of the first device 104 may be generating the first audio and the first device 104 may direct the first audio to the second device 106. When the first user 110 speaks, the first audio may include the spoken words of the first user 110. When the first user 110 is not speaking, the first audio may include background noise of the environment that includes the first device 104. The first device 104 may determine a correlation between the recently directed first audio and the obtained audio. The correlation may be based on a comparison of an audio envelop of the recently directed first audio and an audio envelop of the obtained audio. In these and other embodiments, an audio envelop may include an indication of frequencies and/or amplitudes within audio.

In response to the obtained audio correlating to the recently directed first audio, the first device 104 may determine the obtained audio is echo audio. The obtained audio may be correlated to the recently directed first audio in response to the correlation between the obtained audio and the recently directed first audio satisfying a threshold. The correlation may satisfy the threshold when a correlation value indicating an amount of correlation between the obtained audio and the recently directed first audio, satisfies the threshold. In these and other embodiments, a correlation value may indicate what percentage of the audio envelops of the recently directed first audio and the obtained audio are similar or the same. The threshold may be based on requirements of the transcription system 130 and/or user preferences, among other factors.

The obtained audio, when including echo audio, may correlate to the recently directed first audio because the echo audio may be a replica or substantial replica of the recently directed first audio. Because the echo audio may be a replica or substantial replica of the recently directed first audio, the recently directed first audio and the echo audio may include similar or the same audio envelops.

In response to the obtained audio not correlating to the recently directed first audio, the first device 104 may determine the obtained audio includes second audio that originated at the second device 106. The obtained audio not correlating to the recently directed first audio may result from the correlation between the obtained audio and the recently directed first audio not satisfying the threshold. In these and other embodiments, the obtained audio may include only the second audio from the second device 106. In these and other embodiments, the volume level of the obtained audio may not be adjusted to the particular volume level. Furthermore, in some embodiments, the transcription system 130 may generate a transcription of the obtained audio and provide the transcription to the first device 104 for presentation of the transcription by the first device 104.

Alternately or additionally, the obtained audio may include echo audio and the second audio. For example, the obtained audio may include echo audio and the second audio when both the first user 110 and the second user 112 are speaking. However, because the obtained audio includes the second audio and the echo audio, the volume level of the obtained audio may not be adjusted to the particular volume level. In these and other embodiments, the threshold may be set such that when the obtained audio includes the second audio and the echo audio, the correlation between the obtained audio and the recently directed first audio may not satisfy the threshold. In these and other embodiments, the transcription system 130 may generate a transcription of the obtained audio and provide the transcription to the first device 104 for presentation of the transcription by the first device 104.

Modifications, additions, or omissions may be made to the environment 100 without departing from the scope of the present disclosure. For example, in some embodiments, the environment 100 may include additional devices. In these and other embodiments, the additional devices may be configured to present transcriptions, present a report, obtain user input, present audio, capture audio, among other functions described with respect to the first device 104.

As another example, the first device 104 may be configured to filter the obtained audio before the audio is adjusted. In some embodiments, the filtering may be configured to remove the echo audio from the obtained audio. In these and other embodiments, the filtering may be adaptive filtering that may be configured to estimate the echo audio to remove the echo audio. In these and other embodiments, the first device 104 may filter the obtained audio. The filtered audio may be provided to a speaker of the first device 104 for audibly broadcasting the filtered audio. The first device 104 may also be configured adjust the volume level of the filtered audio to send to the transcription system 130. If the filtering reduced the volume level of the filtered audio below the particular volume level, the first device 104 may increase the volume level such that the volume level of the audio directed to the transcription system 130 is at the particular volume level.

Figure 2:
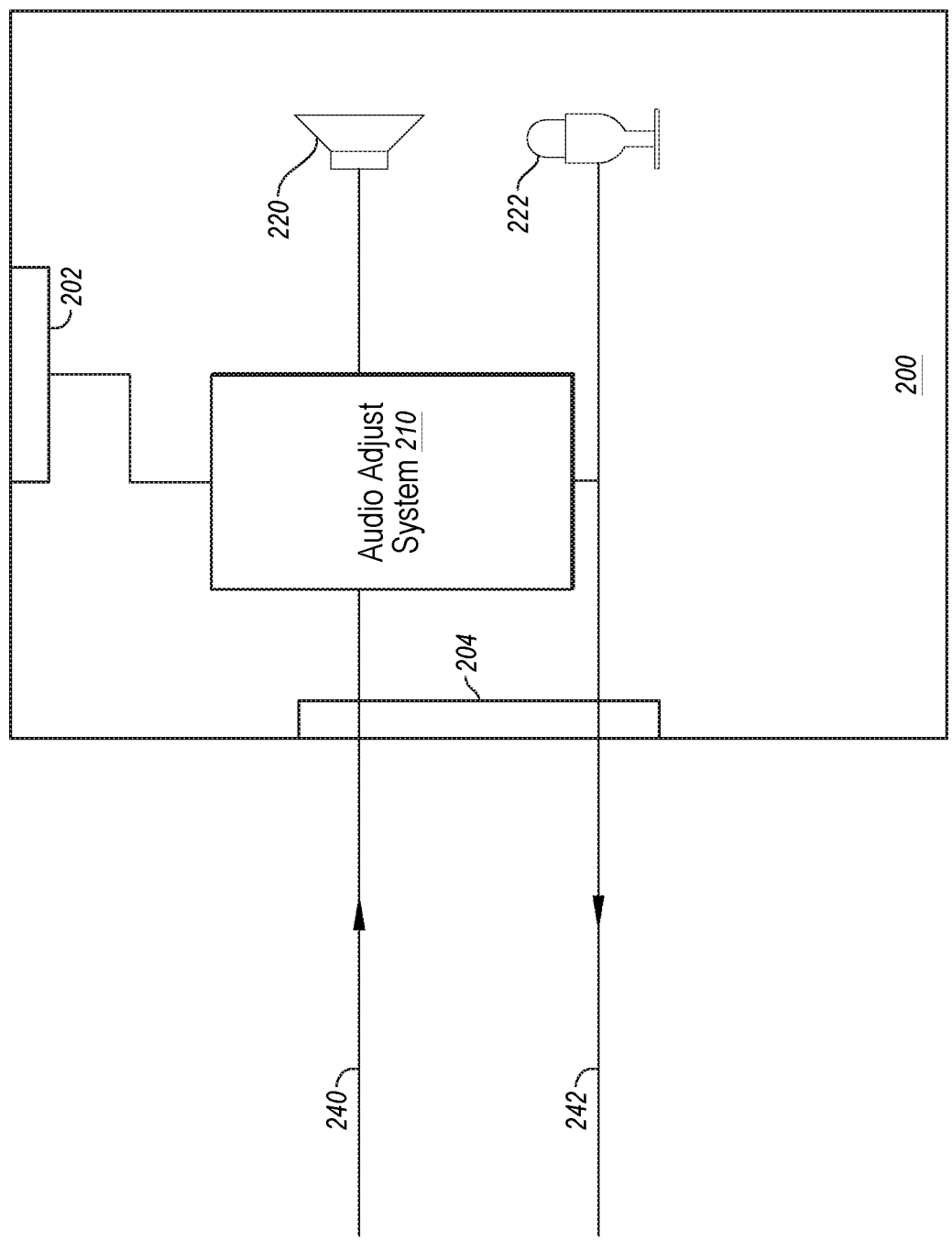
FIG. 2 illustrates an example device that adjusts volume.

FIG. 2 illustrates an example device that adjusts volume. The device 200 may be arranged in accordance with at least one embodiment described in the present disclosure. The device 200 may include a first port 202, a second port 204, an audio adjust system 210, a speaker 220, and a microphone 222. Through the second port 204, the device 200 may be coupled to a receive communication line 240 and a transmit communication line 242. In some embodiments, the device 200 may be example of the first device 104 of FIG. 1. Thus, the device 200 may operate in a manner analogous to the first device 104 of FIG. 1.

The microphone 222 may be configured to capture soundwaves and convert the soundwaves to a first audio signal. For example, the soundwaves may be words spoken by a user of the device 200. The first audio signal may be provided to the audio adjust system 210 and the second port 204. The first audio signal may be sent along the transmit communication line 242. The transmit communication line 242 may be part of a network that is configured to allow the device 200 to establish and maintain a communication session with a remote device.

A second audio signal may be obtained by the device 200 by way of the receive communication line 240 at the second port 204. The second audio signal may be provided to the audio adjust system 210 by the second port. The second audio signal may include remote audio from the remote device during a communication session. The second audio signal may also include echo audio. The echo audio may be an echo of the first audio signal. For example, as the first audio signal is transmitted in the second port 204 or along the transmit communication line 242, a impedance mismatch or other configuration of the network or the second port 204 may result in a portion of the first audio signal being redirected into a different path, such as to the path of the receive communication line 240. As a result, the echo audio may include a signal envelop that is similar or the same as the first audio signal.

The audio adjust system 210 may be configured to obtain the first audio signal and the second audio signal. The audio adjust system 210 may compare the first audio signal and the second audio signal to determine a correlation between the first audio signal and the second audio signal. A correlation may indicate that the second audio signal includes echo audio that resulted from the first audio signal and does not include remote audio from the remote device.

In response to correlation that does not satisfy a threshold, the audio adjust system 210 may not filter or otherwise adjust the volume level of the second audio signal to the particular level or a noise floor. No correlation may indicate that the microphone 222 is not capturing spoken words from a user of the device 200 or that the microphone 222 is capturing spoken words from a user of the device 200 but that the second audio signal also includes remote audio that includes spoken words from a user of the remote device. For example, when users of both of the device 200 and the remote device are speaking.

The audio adjust system 210 may perform one or more other functions to remove noise, reduce clipping, amplify audio, or other adjust the second audio signal. The audio adjust system 210 may provide the second audio signal to the speaker 220 and to the first port 202.

The speaker 220 may be configured to audibly broadcast the second audio signal. The first port 202 may be configured to direct the second audio signal to a remote transcription system. The second audio signal may be directed to the remote transcription system over a wireless or wired connection using any type of communication protocol. The remote transcription system may generate a transcription of the second audio signal and direct the transcription to the first port 202. The transcription may be presented by the device 200.

In response to a correlation that does satisfy a threshold, the audio adjust system 210 may be configured to filter the second audio signal. The filtering may be performed using an adaptive filter that is trained to remove echo audio resulting from the first audio signal.

After filtering the audio, the audio adjust system 210 may determine a volume level of the filtered audio. In response to the volume level being less or more than the particular volume level with respect to the noise floor, the audio adjust system 210 may adjust the volume level of the filtered audio being directed to the remote transcription system. In these and other embodiments, the audio adjust system 210 may calculate the noise floor based on samples of the first and/or second audio signals. The adjusted audio may be provided to the first port 202 for directing to the remote transcription system. An example of the adjustment to the filtered audio is provided with respect to FIG. 3. In some embodiments, the remote transcription system may generate a transcription of the filtered audio. In these and other embodiments, the remote transcription system may or may not provide the transcription of the filtered audio to the device 200 for presentation.

In response to the volume level being more than the noise floor, the audio adjust system 210 may adjust the filtered audio being directed to the speaker 220. For example, the audio adjust system 210 may adjust the filtered audio such that the volume level of the filtered audio is near or at the noise floor. In these and other embodiments, the volume level of the filtered audio being directed to the speaker 220 may be less than the volume level of the filtered audio being directed to the remote transcription system. The speaker 220 may be configured to audibly broadcast the filtered audio.

The audio adjust system 210 may be formed by discrete components that operate to perform the functions of the audio adjust system 210 as discussed in this disclosure. Alternately or additionally, the functions of the audio adjust system 210 may be performed in the digital domain by one or more processors. In these and other embodiments, the device 200 may include memory that may include instructions that when executed by one or more processors may perform the functions of the audio adjust system 210 as discussed in this disclosure. Alternately or additionally, the functions of the audio adjust system 210 may be performed by a combination of discrete components and instructions executed by a processor.

Modifications, additions, or omissions may be made to the device 200 without departing from the scope of the present disclosure. For example, in some embodiments, the device 200 may include a display to present transcriptions from the remote transcription system. Alternately or additionally, the audio adjust system 210 may include various other system components such as analog-to-digital converters, digital-toanalog converters, amplifiers, microprocessors, memory, and/or other devices to allow the device 200 to establish and maintain communication sessions with other devices. Alternately or additionally, the device 200 may include other components to perform other functions.

Figure 3:
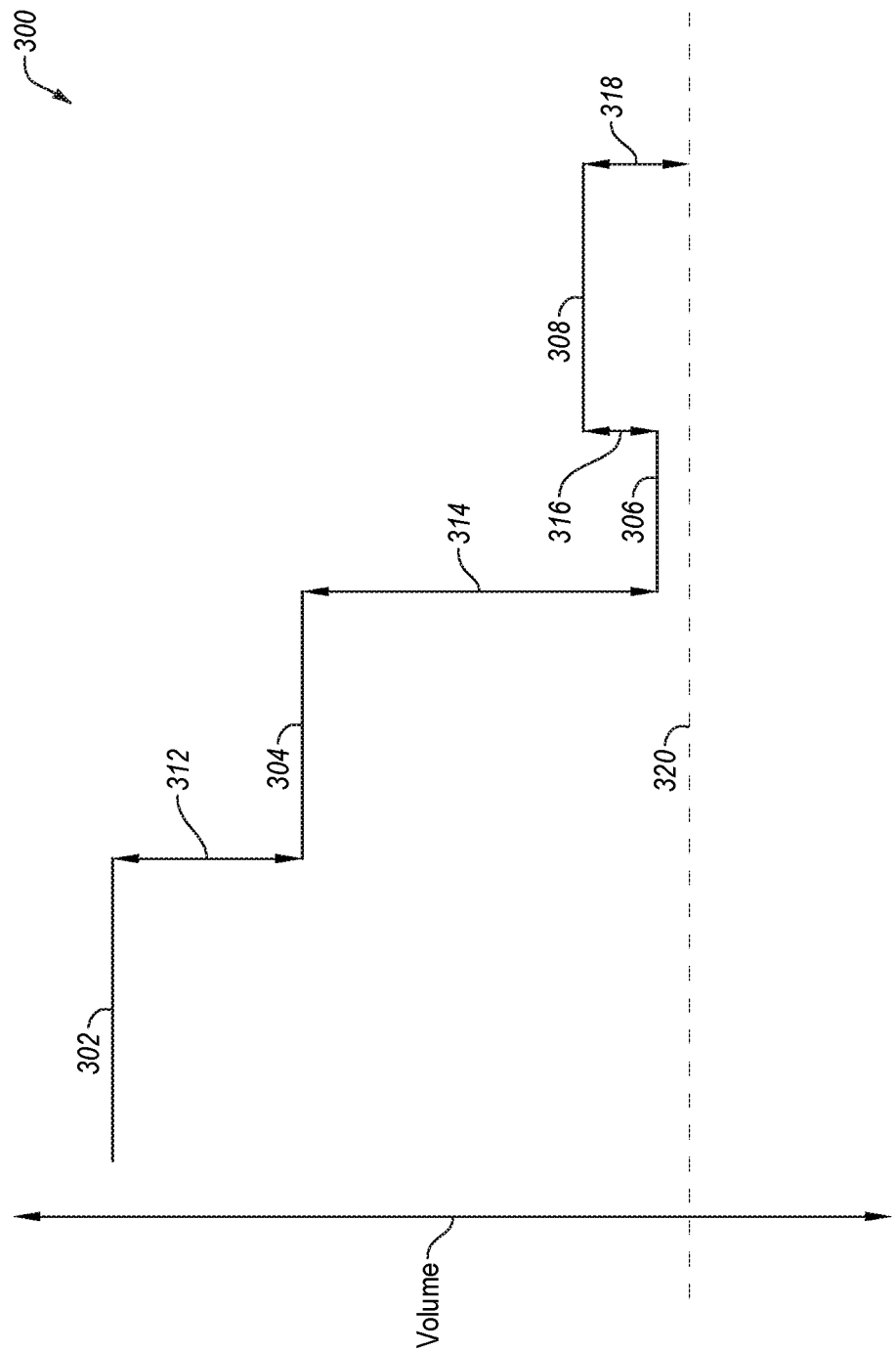
FIG. 3 illustrates a graphical representation of volume adjustment.

FIG. 3 illustrates a graphical representation 300 of volume adjustment. The graphical representation 300 may be arranged in accordance with at least one embodiment described in the present disclosure. The graphical representation 300 may illustrate a volume level of various signals. In particular, the graphical representation 300 may illustrate a volume level of a transmit signal 302, an echo signal 304, a filtered signal 306, and an adjusted signal 308. The graphical representation 300 may further illustrate an echo loss 312, a filter loss 314, an adjustment 316, a particular volume level 318, and a noise floor 320.

In some embodiments, the transmit signal 302 may be an audio signal that is being sent from a device to a remote device during a communication session. As an example, the transmit signal 302 may be the first audio signal of FIG. 2. The echo signal 304 may be an echo of the transmit signal 302 that occurs during transmission of the signal 302 that is received at a receive port of the device. As an example, the transmit signal 302 may be the second audio signal of FIG. 2.

In some embodiments, the filtered signal 306 may be an audio signal that results after filtering of the echo signal 304 by a device to remove the echo signal. As an example, the filtered signal 306 may be the filtered audio signal of FIG. 2. The adjusted signal 308 may be an audio signal that results after the filtered signal 306 is adjusted so that the volume level of the adjusted signal 308 is the particular volume level 318 above the noise floor 320. As an example, the adjusted signal 308 may be the adjusted audio signal of FIG. 2.

In some embodiments, the echo loss 312 may represent an amount of volume level loss that occurs when the echo signal occurs from the transmit signal 302. For example, the echo 312 loss may represent echo return loss in some embodiments. The filter loss 314 may represent an amount of volume level loss that occurs when the echo signal 304 is filtered. For example, the filter loss 314 may represent echo return loss enhancement in some embodiments. The adjustment 316 may represent an amount of volume gain or loss that is applied to the filtered signal 306 so that the adjusted signal 308 is at the particular volume level 318 above the noise floor 320.

Modifications, additions, or omissions may be made to the graphical representation 300 without departing from the scope of the present disclosure. For example, the filter loss 314 may not be enough to lower the volume level of the filtered signal 306 below the particular volume level 318. In these and other embodiments, the adjustment 316 may reduce the volume level of the filtered signal 306 to the particular volume level 318 to result in the adjusted signal 308 being at the particular volume level 318 above the noise floor 320. Any changes in the noise floor 320 may result in changes to the volume level of the adjusted signal 308 and an amount of the adjustment 316 to maintain the volume level of the adjusted signal 308 at the particular volume level 318 above the noise floor 320.

Figure 4A:
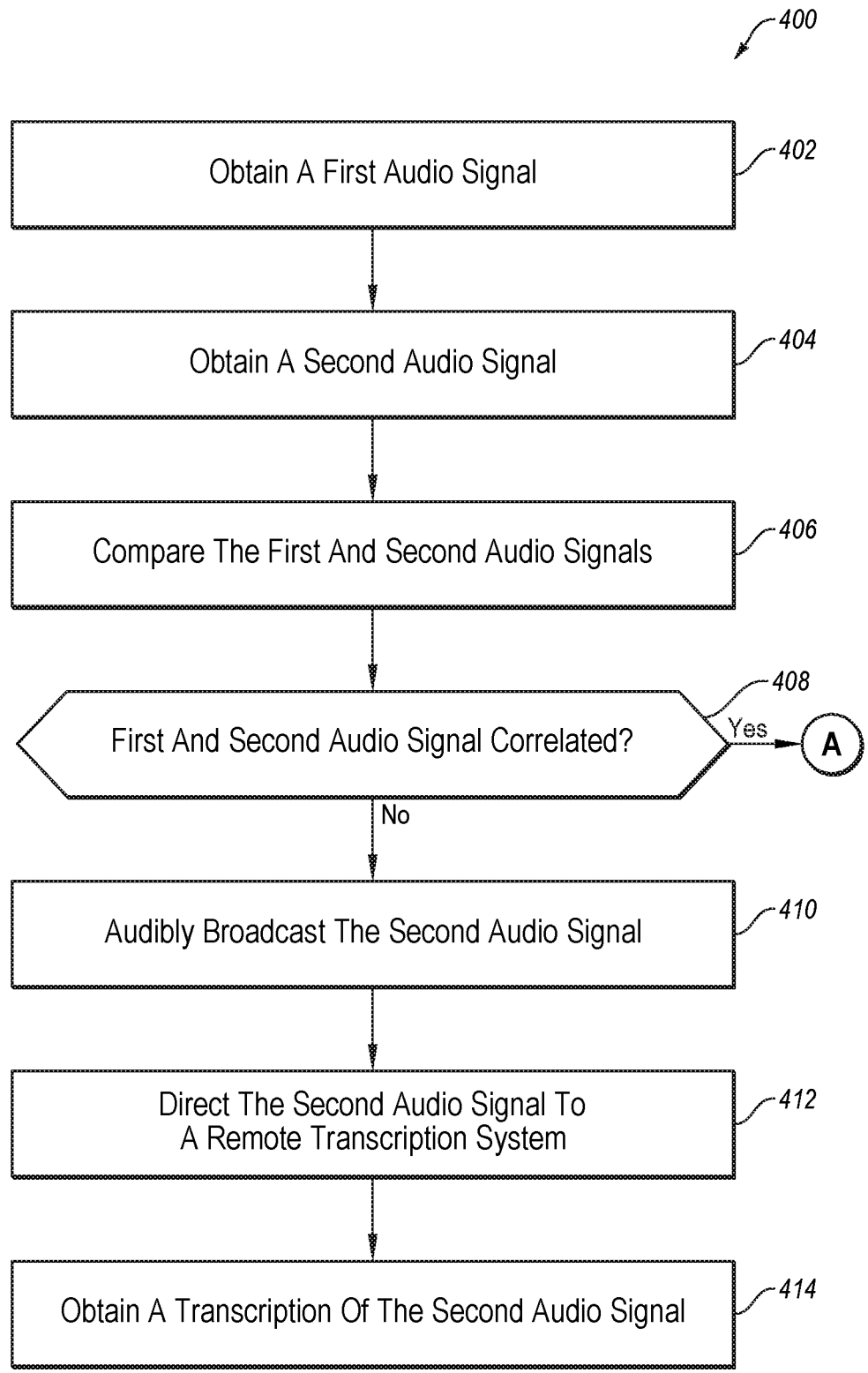
FIGS. 4A and 4B illustrate a flowchart of an example method to adjust volume.
Figure 4B:
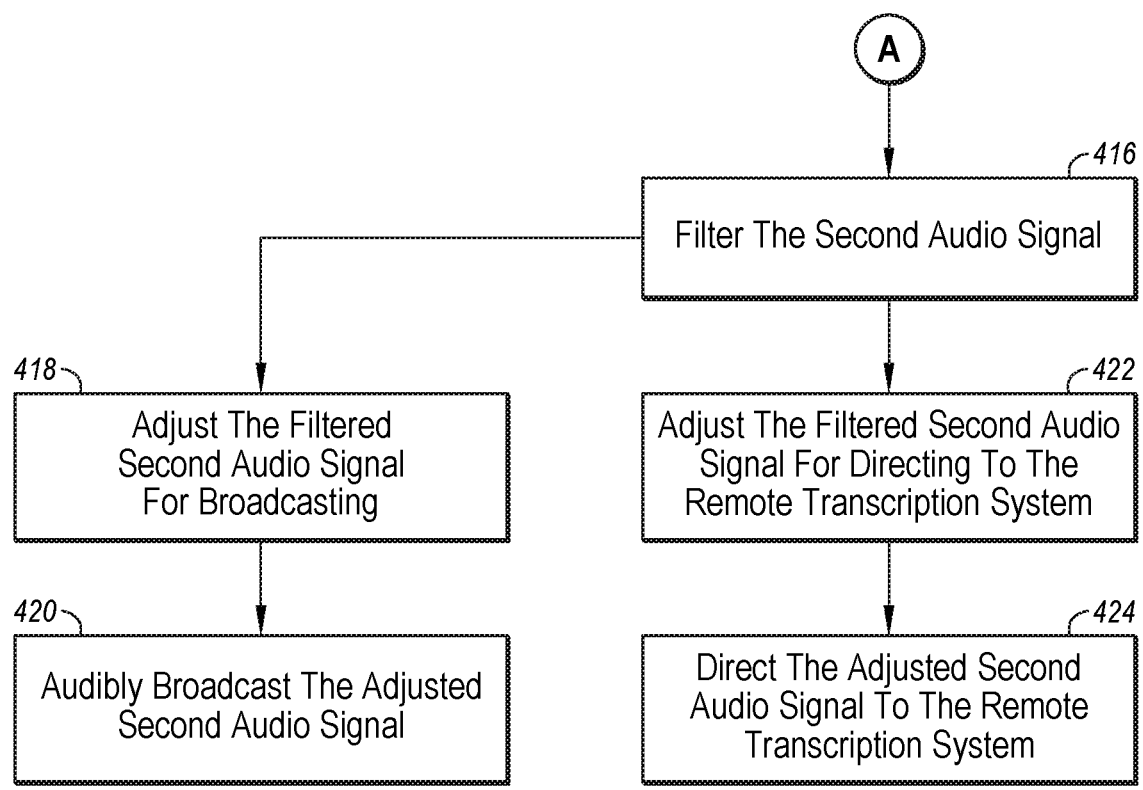

FIGS. 4A and 4B illustrate a flowchart of an example method 400 to adjust volume. The method 400 may be arranged in accordance with at least one embodiment described in the present disclosure. One or more operations of the method 400 may be performed, in some embodiments, by a device or system, such as the first device 104 or device 200 of FIGS. 1 and 2 or another device or combination of devices. In these and other embodiments, the method 400 may be performed based on the execution of instructions stored on one or more non-transitory computer-readable media. Although illustrated as discrete blocks, various blocks may be divided into additional blocks, combined into fewer blocks, or eliminated, depending on the desired implementation.

The method 400 may begin at block 402, where a first audio signal may be obtained at a device. The first audio signal may be an audio signal generated by a microphone of the device. When a user of the device is speaking, the first audio signal may include speech of the user. Otherwise, the first audio signal may include noise and/or background noise of the environment of the device.

At block 404, a second audio signal may be obtained at the device. The second audio signal may include a remote audio signal that originates at a remote device during a communication session between the remote device and the device. For example, the device may be the first device 104 of FIG. 1 and the remote device may be the second device 106 of FIG. 1. The second audio signal may be obtained at a receive port of the device. In these and other embodiments, the second audio signal may also include echo audio of the first audio signal.

At block 406, the first audio signal may be compared to the second audio signal. The comparison between the first audio signal and the second audio signal may be performed by correlating the first audio signal and the second audio signal. In these and other embodiments, the correlation between the first audio signal and the second audio signal may be determined based on the signal envelops of the first audio signal and the second audio signal.

At block 408, it may be determined if the first audio signal is correlated to the second audio signal based on the comparison of the first audio signal to the second audio signal. In response to the first audio signal being correlated to the second audio signal the method 400 may proceed to block 416. In these and other embodiments, the correlation may indicate that the second audio signal may include an echo signal and may not include remote audio from the remote device. In response to the first audio signal not being correlated to the second audio signal, the method 400 may proceed to block 410. In these and other embodiments, the non-correlation may indicate that the second audio signal may include remote audio from the remote device and does not include an echo signal or that the second audio signal may include the remote audio and an echo signal resulting from users of both the device and the remote device speaking.

At block 410, the second audio signal may be audibly broadcast by the device. For example, a speaker of the device may audibly broadcast the second audio signal.

At block 412, the second audio signal may be directed to the remote transcription system by the device. The remote transcription system may be configured to generate a transcription of words within the second audio signal.

At block 414, a transcription of the second audio signal may be obtained at the device from the remote transcription system. In these and other embodiments, the device may be configured to present the transcription. The transcription may be obtained in substantially real-time, such that the transcription is presented during the communication session and a time difference between when words are audibly broadcast and corresponding words are presented in the transcription is less than five, ten, fifteen, or twenty seconds.

At block 416, the second audio signal may be filtered by the device. The filtering may be adaptive filtering configured to reduce the echo audio in the second audio signal.

At block 418, the filtered second audio signal may be adjusted for audibly broadcasting by the device. The adjustment may include reducing the volume level of the second audio signal to the noise floor. Thus, the volume level of the filtered second audio signal may be reduced to less than the particular volume level for the filtered second audio signal audibly broadcasted by the device.

At block 420, the adjusted second audio signal may be audibly broadcast by the device. For example, a speaker of the device may audibly broadcast the adjusted second audio signal.

At block 422, the filtered second audio signal may be adjusted for directing to the remote transcription system. The filtered second audio signal may be adjusted to the particular volume level. In some embodiments, the filtered second audio signal may be adjusted by decreasing the volume level of the filtered second audio signal. Alternately or additionally, the filtered second audio signal may be adjusted by increasing the volume level of the filtered second audio signal when the filtering of the second audio signal reduces the volume level of the second audio signal below the particular volume level.

At block 424, the adjusted second audio signal may be directed to the remote transcription system by the device. The adjusted second audio signal may be audibly broadcast by a revoicing transcription system of the remote transcription system. The adjusted second audio signal may be at the particular volume level to allow the human agent to hear the adjusted second audio signal at a consistent level during the communication session. The adjusted second audio signal may be at a volume level that is less than the second audio signal sent to the remote transcription system in block 412 for which a transcription is generated by the remote transcription system. In these and other embodiments, the remote transcription system may or may not generate a transcription of the adjusted second audio signal. In these and other embodiments, when the remote transcription system generates the transcription of the adjusted second audio signal, the remote transcription may not provide the transcription of the adjusted second audio signal to the device for presentation.

It is understood that, for this and other processes, operations, and methods disclosed herein, the functions and/or operations performed may be implemented in differing order. Furthermore, the outlined functions and operations are only provided as examples, and some of the functions and operations may be optional, combined into fewer functions and operations, or expanded into additional functions and operations without detracting from the essence of the disclosed embodiments.

Figure 5:
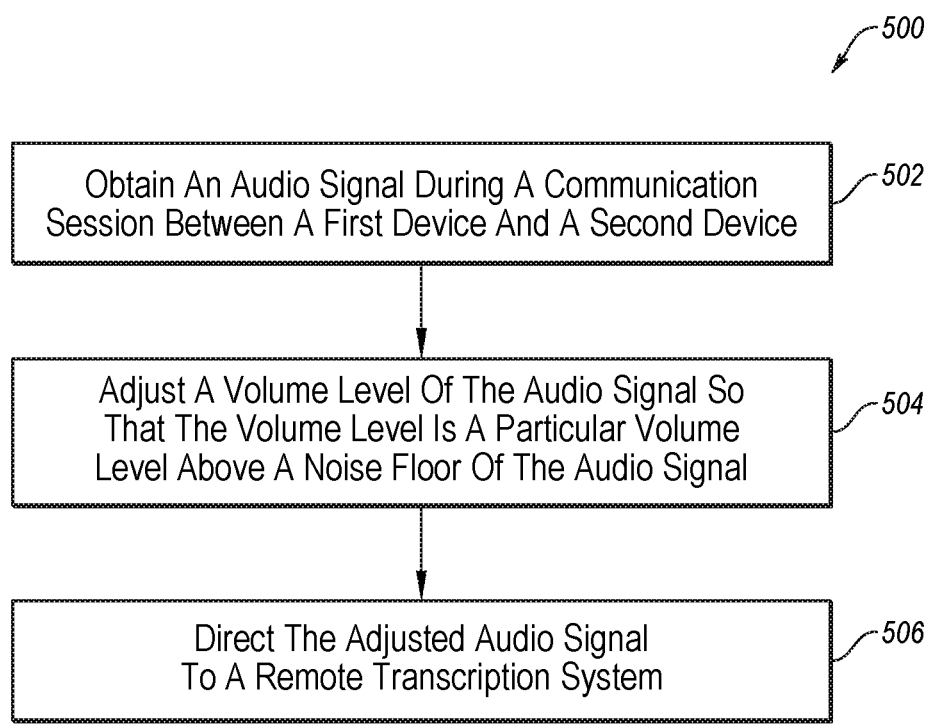
FIG. 5 illustrates a flowchart of another example method to adjust volume.

FIG. 5 illustrates a flowchart of an example method 500 to select a transcription generation technique. The method 500 may be arranged in accordance with at least one embodiment described in the present disclosure. One or more operations of the method 500 may be performed, in some embodiments, by a device or system, such as the first device 104 or device 200 of FIGS. 1 and 2 or another device or combination of devices. In these and other embodiments, the method 500 may be performed based on the execution of instructions stored on one or more non-transitory computer-readable media. Although illustrated as discrete blocks, various blocks may be divided into additional blocks, combined into fewer blocks, or eliminated, depending on the desired implementation.

The method 500 may begin at block 502, where an audio signal may be obtained during a communication session between a first device and a second device. In some embodiments, the audio signal may include an echo of a second audio signal directed by the first device to the second device during the communication session. At block 504, a volume level of the audio signal may be adjusted so that the volume level is a particular volume level above a noise floor of the audio signal. At block 506, the adjusted audio signal may be directed to a remote transcription system.

In some embodiments, adjusting the volume level of the audio signal may include increasing the volume level of the audio signal to the particular volume level. Alternately or additionally, adjusting the volume level of the audio signal may include decreasing the volume level of the audio signal to the particular volume level. In some embodiments, the particular volume level may be a volume level audible by a human. In some embodiments, the first device may not receive transcriptions from the remote transcription system for the audio signal with the adjusted volume level.

It is understood that, for this and other processes, operations, and methods disclosed herein, the functions and/or operations performed may be implemented in differing order. Furthermore, the outlined functions and operations are only provided as examples, and some of the functions and operations may be optional, combined into fewer functions and operations, or expanded into additional functions and operations without detracting from the essence of the disclosed embodiments.

For example, in some embodiments, the method 500 may further include obtaining a second audio signal from a microphone of the first device and comparing the audio signal and the second audio signal. In these and other embodiments, the volume level of the audio signal may be adjusted in response to the comparison of the audio signal and the second audio signal. In some embodiments, the volume level of the audio signal may be adjusted in response to the comparison of the audio signal and the second audio signal indicating a correlation between the audio signal and the second audio signal.

The method 500 may further include in response to the comparison of the audio signal and the second audio signal indicating a correlation between the audio signal and the second audio signal, filtering the audio signal before adjusting the volume level of the audio signal.

Alternately or additionally, the audio signal may be filtered in response to the comparison of the audio signal and the second audio signal indicating a correlation between the audio signal and the second audio signal.

Figure 6:
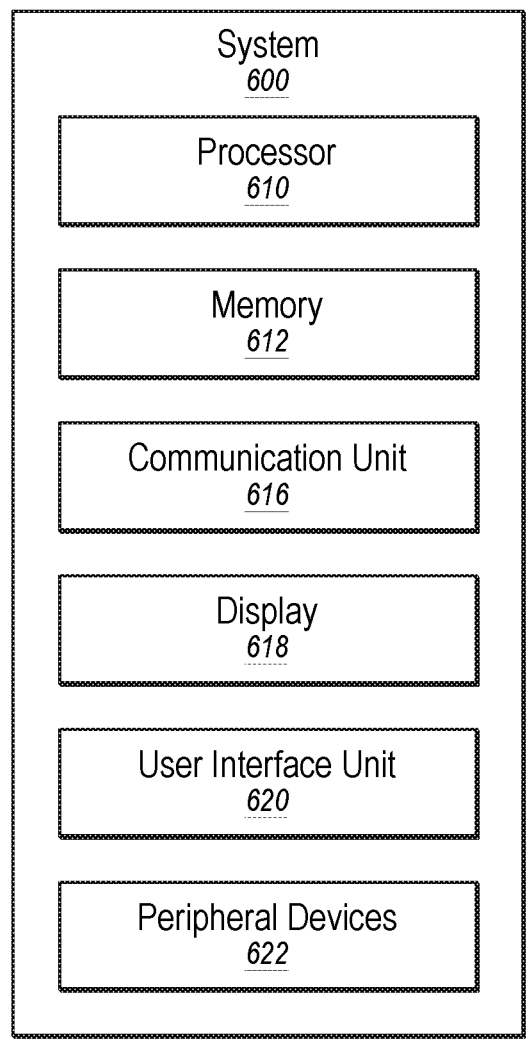
FIG. 6 illustrates an example system that may be used during volume adjustment.

FIG. 6 illustrates an example system 600 that may be used during transcription of communications. The system 600 may be arranged in accordance with at least one embodiment described in the present disclosure. The system 600 may include a processor 610, memory 612, a communication unit 616, a display 618, a user interface unit 620, and a peripheral device 622, which all may be communicatively coupled. In some embodiments, the system 600 may be part of any of the systems or devices described in this disclosure.

For example, the system 600 may be part of the first device 104 of FIG. 1 and may be configured to perform one or more of the tasks described above with respect to the first device 104. As another example, the system 600 may be part of the second device 106 of FIG. 1 and may be configured to perform one or more of the tasks described above with respect to the second device 106. As another example, the system 600 may be part of the transcription system 130 of FIG. 1 and may be configured to perform one or more of the tasks described above with respect to the transcription system 130.

Generally, the processor 610 may include any suitable special-purpose or general-purpose computer, computing entity, or processing device including various computer hardware or software modules and may be configured to execute instructions stored on any applicable computer-readable storage media. For example, the processor 610 may include a microprocessor, a microcontroller, a parallel processor such as a graphics processing unit (GPU) or tensor processing unit (TPU), a digital signal processor (DSP), an application-specific integrated circuit (ASIC), a Field-Programmable Gate Array (FPGA), or any other digital or analog circuitry configured to interpret and/or to execute program instructions and/or to process data.

Although illustrated as a single processor in FIG. 6, it is understood that the processor 610 may include any number of processors distributed across any number of networks or physical locations that are configured to perform individually or collectively any number of operations described herein. In some embodiments, the processor 610 may interpret and/or execute program instructions and/or process data stored in the memory 612. In some embodiments, the processor 610 may execute the program instructions stored in the memory 612.

For example, in some embodiments, the processor 610 may execute program instructions stored in the memory 612 that are related to adjusting volume such that the system 600 may perform or direct the performance of the operations associated therewith as directed by the instructions. In these and other embodiments, the instructions may be used to perform one or more operations of the method 400 or the method 500 of FIGS. 4A, 4B, and 5.

The memory 612 may include computer-readable storage media or one or more computer-readable storage mediums for carrying or having computer-executable instructions or data structures stored thereon. Such computer-readable storage media may be any available media that may be accessed by a general-purpose or special-purpose computer, such as the processor 610.

By way of example, and not limitation, such computer-readable storage media may include non-transitory computer-readable storage media including Random Access Memory (RAM), Read-Only Memory (ROM), Electrically Erasable Programmable Read-Only Memory (EEPROM), Compact Disc Read-Only Memory (CD-ROM) or other optical disk storage, magnetic disk storage or other magnetic storage devices, flash memory devices (e.g., solid state memory devices), or any other storage medium which may be used to carry or store particular program code in the form of computer-executable instructions or data structures and which may be accessed by a general-purpose or special-purpose computer. Combinations of the above may also be included within the scope of computer-readable storage media.

Computer-executable instructions may include, for example, instructions and data configured to cause the processor 610 to perform a certain operation or group of operations as described in this disclosure. In these and other embodiments, the term "non-transitory" as explained in the present disclosure should be construed to exclude only those types of transitory media that were found to fall outside the scope of patentable subject matter in the Federal Circuit decision of *In re Nuuten,* 500 F.3d 1346 (Fed. Cir. 2007). Combinations of the above may also be included within the scope of computer-readable media.

The communication unit 616 may include any component, device, system, or combination thereof that is configured to transmit or receive information over a network. In some embodiments, the communication unit 616 may communicate with other devices at other locations, the same location, or even other components within the same system. For example, the communication unit 616 may include a modem, a network card (wireless or wired), an infrared communication device, a wireless communication device (such as an antenna), and/or chipset (such as a Bluetooth device, an 802.6 device (e.g., Metropolitan Area Network (MAN)), a WiFi device, a WiMax device, cellular communication facilities, etc.), and/or the like. The communication unit 616 may permit data to be exchanged with a network and/or any other devices or systems described in the present disclosure. For example, when the system 600 is included in the first device 104 of FIG. 1, the communication unit 616 may allow the first device 104 to communicate with the transcription system 130.

The display 618 may be configured as one or more displays, like an LCD, LED, Braille terminal, or other type of display. The display 618 may be configured to present video, text captions, user interfaces, and other data as directed by the processor 610. For example, when the system 600 is included in the first device 104 of FIG. 1, the display 618 may be configured to present a transcript of second audio from the second device.

The user interface unit 620 may include any device to allow a user to interface with the system 600. For example, the user interface unit 620 may include a mouse, a track pad, a keyboard, buttons, camera, and/or a touchscreen, among other devices. The user interface unit 620 may receive input from a user and provide the input to the processor 610. In some embodiments, the user interface unit 620 and the display 618 may be combined.

The peripheral devices 622 may include one or more devices. For example, the peripheral devices may include a microphone, an imager, and/or a speaker, among other peripheral devices. In these and other embodiments, the microphone may be configured to capture audio. The imager may be configured to capture images. The images may be captured in a manner to produce video or image data. In some embodiments, the speaker may broadcast audio received by the system 600 or otherwise generated by the system 600.

Modifications, additions, or omissions may be made to the system 600 without departing from the scope of the present disclosure. For example, in some embodiments, the system 600 may include any number of other components that may not be explicitly illustrated or described. Further, depending on certain implementations, the system 600 may not include one or more of the components illustrated and described.

As indicated above, the embodiments described herein may include the use of a special purpose or general-purpose computer (e.g., the processor 610 of FIG. 6) including various computer hardware or software modules, as discussed in greater detail below. Further, as indicated above, embodiments described herein may be implemented using computer-readable media (e.g., the memory 612 of FIG. 6) for carrying or having computer-executable instructions or data structures stored thereon.

In some embodiments, the different components, modules, engines, and services described herein may be implemented as objects or processes that execute on a computing system (e.g., as separate threads). While some of the systems and methods described herein are generally described as being implemented in software (stored on and/or executed by general purpose hardware), specific hardware implementations or a combination of software and specific hardware implementations are also possible and contemplated.

In accordance with common practice, the various features illustrated in the drawings may not be drawn to scale. The illustrations presented in the present disclosure are not meant to be actual views of any particular apparatus (e.g., device, system, etc.) or method, but are merely idealized representations that are employed to describe various embodiments of the disclosure. Accordingly, the dimensions of the various features may be arbitrarily expanded or reduced for clarity. In addition, some of the drawings may be simplified for clarity. Thus, the drawings may not depict all of the components of a given apparatus (e.g., device) or all operations of a particular method.

Terms used herein and especially in the appended claims (e.g., bodies of the appended claims) are generally intended as "open" terms (e.g., the term "including" should be interpreted as "including, but not limited to," the term "having" should be interpreted as "having at least," the term "includes" should be interpreted as "includes, but is not limited to," etc.).

Additionally, if a specific number of an introduced claim recitation is intended, such an intent will be explicitly recited in the claim, and in the absence of such recitation no such intent is present. For example, as an aid to understanding, the following appended claims may contain usage of the introductory phrases "at least one" and "one or more" to introduce claim recitations. However, the use of such phrases should not be construed to imply that the introduction of a claim recitation by the indefinite articles "a" or "an" limits any particular claim containing such introduced claim recitation to embodiments containing only one such recitation, even when the same claim includes the introductory phrases "one or more" or "at least one" and indefinite articles such as "a" or "an" (e.g., "a" and/or "an" should be interpreted to mean "at least one" or "one or more"); the same holds true for the use of definite articles used to introduce claim recitations.

In addition, even if a specific number of an introduced claim recitation is explicitly recited, it is understood that such recitation should be interpreted to mean at least the recited number (e.g., the bare recitation of "two recitations," without other modifiers, means at least two recitations, or two or more recitations). Furthermore, in those instances where a convention analogous to "at least one of A, B, and C, etc." or "one or more of A, B, and C, etc." is used, in general such a construction is intended to include A alone, B alone, C alone, A and B together, A and C together, B and C together, or A, B, and C together, etc. For example, the use of the term "and/or" is intended to be construed in this manner.

Further, any disjunctive word or phrase presenting two or more alternative terms, whether in the description, claims, or drawings, should be understood to contemplate the possibilities of including one of the terms, either of the terms, or both terms. For example, the phrase "A or B" should be understood to include the possibilities of "A" or "B" or "A and B."

Additionally, the use of the terms "first," "second," "third," etc., are not necessarily used herein to connote a specific order or number of elements. Generally, the terms "first," "second," "third," etc., are used to distinguish between different elements as generic identifiers. Absence a showing that the terms "first," "second," "third," etc., connote a specific order, these terms should not be understood to connote a specific order. Furthermore, absence a showing that the terms first," "second," "third," etc., connote a specific number of elements, these terms should not be understood to connote a specific number of elements. For example, a first widget may be described as having a first side and a second widget may be described as having a second side. The use of the term "second side" with respect to the second widget may be to distinguish such side of the second widget from the "first side" of the first widget and not to connote that the second widget has two sides.

All examples and conditional language recited herein are intended for pedagogical objects to aid the reader in understanding the invention and the concepts contributed by the inventor to furthering the art, and are to be construed as being without limitation to such specifically recited examples and conditions. Although embodiments of the present disclosure have been described in detail, it should be understood that the various changes, substitutions, and alterations could be made hereto without departing from the spirit and scope of the present disclosure.

The invention claimed is:

1. A method to adjust volume, the method comprising:
obtaining, from a communication port of a first device, an audio signal during a communication session between the first device and a second device;
obtaining, from a microphone of the first device, a second audio signal different than the audio signal, wherein the audio signal includes an echo of the second audio signal directed by the first device to the second device during the communication session;
comparing the audio signal and the second audio signal;
in response to the comparison of the audio signal and the second audio signal, adjusting, at the first device, a volume level of the audio signal and a volume level of the echo included in the audio signal so that the volume level of the audio signal and the echo is a particular volume level above a noise floor of the audio signal; and
after adjusting the volume level, directing the adjusted audio signal and the adjusting echo from the first device to a remote transcription system configured to generate text based on words within audio.

2. The method of claim 1, wherein adjusting the volume level of the audio signal includes increasing the volume level of the audio signal to the particular volume level.

3. The method of claim 1, wherein adjusting the volume level of the audio signal includes decreasing the volume level of the audio signal to the particular volume level.

4. The method of claim 1, wherein the volume level of the audio signal is adjusted in response to the comparison of the audio signal and the second audio signal indicating a correlation between the audio signal and the second audio signal.

5. The method of claim 1, further comprising in response to the comparison of the audio signal and the second audio signal indicating a correlation between the audio signal and the second audio signal, filtering the audio signal before adjusting the volume level of the audio signal.

6. The method of claim 1, wherein the particular volume level is a volume level audible by a human.

7. The method of claim 1, wherein the first device does not receive transcriptions from the remote transcription system for the audio signal with the adjusted volume level.

8. At least one non-transitory computer-readable media configured to store one or more instructions that in response to being executed by at least one computing system cause performance of the method of claim 1.

9. A device comprising:
one or more processors; and
one or more non-transitory computer-readable mediums configured to store instructions that when executed by the processors cause or direct the device to perform operations, the operations comprising:
  obtain an audio signal during a communication session with a remote device;
  adjust a volume level of first portions of the audio signal so that the volume level is a particular volume level above a noise floor of the audio signal, the particular volume level being audible by a human;
  after adjusting the volume level, direct the adjusted first portions of the audio signal to a remote transcription system configured to generate text based on words within audio; and
  obtaining, at the device, transcriptions from the remote transcription system for second portions of the audio signal and not for the adjusted first portions of the audio signal.

10. The device of claim 9, wherein adjusting the volume level of the audio signal includes increasing the volume level of the audio signal to the particular volume level.

11. The device of claim 9, wherein adjusting the volume level of the audio signal includes decreasing the volume level of the audio signal to the particular volume level.

12. The device of claim 9, further comprising a speaker configured to audibly broadcast the audio signal.

13. The device of claim 9, further comprising a microphone configured to capture audio to generate a second audio signal directed to the remote device during the communication session, wherein the audio signal includes an echo of the second audio signal.

14. The device of claim 13, wherein the operations further comprise compare the audio signal and the second audio signal, wherein the volume level of the audio signal is adjusted in response to the comparison of the audio signal and the second audio signal.

15. The device of claim 14, wherein the volume level of the audio signal is adjusted in response to the comparison of the audio signal and the second audio signal indicating a correlation between the audio signal and the second audio signal.

16. A method to adjust volume, the method comprising:
  obtaining, at a first device, an audio signal that originates at a second device, the audio signal including an echo of a second audio signal transmitted by the first device to the second device;
  adjusting, at the first device, a volume level of the audio signal so that the volume level of the echo included in the audio signal is a particular volume level above a noise floor of the audio signal; and
  after adjusting the volume level, directing the adjusted audio signal with the echo at the particular volume level from the first device to a remote transcription system configured to generate text based on words within audio.

17. The method of claim 16, wherein adjusting the volume level of the audio signal includes increasing the volume level of the audio signal to the particular volume level.

18. The method of claim 16, wherein adjusting the volume level of the audio signal includes decreasing the volume level of the audio signal to the particular volume level.

19. The method of claim 16, wherein the particular volume level is a volume level audible by a human.

* * * * *